United States Patent
Zou

(10) Patent No.: US 11,526,423 B2
(45) Date of Patent: Dec. 13, 2022

(54) WIRELESS DEBUGGER AND WIRELESS DEBUGGING SYSTEM

(71) Applicant: SHENZHEN GOODIX TECHNOLOGY CO., LTD., Shenzhen (CN)

(72) Inventor: Nan Zou, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 338 days.

(21) Appl. No.: 16/830,594

(22) Filed: Mar. 26, 2020

(65) Prior Publication Data

US 2021/0109840 A1    Apr. 15, 2021

(30) Foreign Application Priority Data

Oct. 12, 2019    (CN) .......................... 201910967794.1

(51) Int. Cl.
| | |
|---|---|
| G06F 11/36 | (2006.01) |
| H04W 4/80 | (2018.01) |
| G01R 31/3177 | (2006.01) |
| G06F 13/38 | (2006.01) |
| G06F 13/42 | (2006.01) |

(52) U.S. Cl.
CPC ........ G06F 11/362 (2013.01); G01R 31/3177 (2013.01); G06F 13/385 (2013.01); G06F 13/4282 (2013.01); H04W 4/80 (2018.02); G06F 2213/0042 (2013.01)

(58) Field of Classification Search
CPC .................................................. G06F 11/3648
See application file for complete search history.

(56) References Cited

U.S. PATENT DOCUMENTS

| | | | | |
|---|---|---|---|---|
| 9,632,137 | B2* | 4/2017 | Ramsay | ........... G01R 31/31705 |
| 2006/0048006 | A1 | 3/2006 | Lou | |
| 2014/0068342 | A1 | 3/2014 | Chuang | |
| 2017/0176523 | A1* | 6/2017 | Menon | ............. G01R 31/31703 |
| 2018/0365130 | A1* | 12/2018 | Hintsala | ............... G06F 11/3664 |

FOREIGN PATENT DOCUMENTS

WO    2017106393    6/2017

* cited by examiner

*Primary Examiner* — Henry Tsai
*Assistant Examiner* — Juanito C Borromeo
(74) *Attorney, Agent, or Firm* — Emerson, Thomson & Bennett, LLC; Roger D. Emerson; Warren A. Rosborough

(57) ABSTRACT

Embodiments of the present disclosure provide a wireless debugger and a wireless debugging system. The wireless debugger includes: a processor, a wireless communication module, and a first peripheral interface; the processor is electrically connected to the wireless communication module and the first peripheral interface, respectively; the processor, is configured to receive debugging instructions through the wireless communication module, and the debugging instructions are used to instruct debugging/stop debugging a target board; the processor, is further configured to parse the debugging instructions and convert the parsed debugging instructions so that the debugging instructions are adapted to a protocol of the first peripheral interface; and the processor, is further configured to transmit the converted debugging instructions to the to-be-debugged target board through the first peripheral interface. Debugging control is convenient and reliable.

14 Claims, 2 Drawing Sheets

WIRELESS DEBUGGER AND WIRELESS DEBUGGING SYSTEM

CROSS-REFERENCE TO RELATED APPLICATION

This application claims the priority to Chinese Application No. CN201910967794.1, entitled "Wireless Debugger and Wireless Debugging System" filed on Oct. 12, 2019, the application of which is hereby incorporated by reference in its entirety.

TECHNICAL FIELD

Embodiments of the present disclosure relate to the field of electronics and information technology, and more specifically to a wireless debugger and a wireless debugging system.

BACKGROUND

During the R&D and design of an electronic device, after the engineer writes a program code, he/she needs to download the program to a target board and then perform simulation debugging to find and solve program running abnormal points. As technology develops, many electronic devices are mobile, such as small drones, wearable devices, or cluster networking devices. These electronic devices all need to be debugged in motion. However, in related technology, when debugging an electronic device, it is necessary to connect to the target board for debugging through an wired transmission interface. The debugging is very inconvenient, and the reliability of debugging in motion is low.

SUMMARY

In view of this, one of the technical problems addressed by embodiments of the present disclosure is to provide a wireless debugger and a wireless debugging system to overcome the above defects.

In a first aspect, an embodiment of the present disclosure provides a wireless debugger, including: a processor, a wireless communication module, and a first peripheral interface; the processor is electrically connected to the wireless communication module and the first peripheral interface, respectively;

the processor, is configured to receive debugging instructions through the wireless communication module, and the debugging instructions are used to instruct debugging/stop debugging a target board;

the processor, is further configured to parse the debugging instructions and convert the parsed debugging instructions so that the debugging instructions are adapted to a protocol of the first peripheral interface; and the processor, is further configured to transmit the converted debugging instructions to the to-be-debugged target board through the first peripheral interface.

Alternatively, in an embodiment of the present disclosure, the wireless communication module includes at least one of a Bluetooth module, a Wi-Fi module, or a 2.4G module.

Alternatively, in an embodiment of the present disclosure, the Bluetooth module includes a BLE (Bluetooth low energy) chip and an antenna, and the BLE chip is electrically connected to the antenna.

Alternatively, in an embodiment of the present disclosure, the first peripheral interface includes at least one of the following interfaces: a Serial Wire Debugging (SWD) interface, a Serial Peripheral Interface (SPI), an Inter-Integrated Circuit (I2C) interface, an Integrate-Interface Circuit (IIS) interface, a General-Purpose Input/Output (GPIO) interface, or a Pulse Width Modulation (PWM) interface.

Alternatively, in an embodiment of the present disclosure, the first peripheral interface is the SWD interface; and the wireless debugger, is specifically configured to parse the debugging instructions and convert the parsed debugging instructions into a format of an SWD interface protocol.

Alternatively, in an embodiment of the present disclosure, the first peripheral interface is the GPIO general-purpose input/output interface, and the GPIO interface is configured with an SWD protocol as the SWD interface simulated.

The apparatus according to claim 1, wherein, the processor, is specifically configured to transmit the converted debugging instructions to the target board through the first peripheral interface, when the debugging instructions instructs the target board to debug, to control the target board to debug; transmit the converted debugging instructions to the target board through the first peripheral interface, when the debugging instructions instructs the target board to suspend debugging, to control the target board to suspend debugging; and transmit the converted debugging instructions to the target board through the first peripheral interface, when the debugging instructions instructs the target board to perform single-step debugging, to control the target board to perform single-step debugging.

Alternatively, in an embodiment of the present disclosure, the wireless debugger further includes a second peripheral interface; and the processor, is further configured to receive log information transmitted by the target board through the second peripheral interface.

Alternatively, in an embodiment of the present disclosure, the second peripheral interface is a Universal Asynchronous Receiver/Transmitter (UART) universal asynchronous receiver transmitter interface.

Alternatively, in an embodiment of the present disclosure, the wireless debugger further includes a memory, and the memory is electrically connected to the processor; and the memory, is configured to store data and a program executed by the processor.

In a first aspect, an embodiment of the present disclosure provides a wireless debugging system, including: a wireless debugger, a target board, and a control device, the wireless debugger is the wireless debugger described according to any one of claims 1-10, the wireless debugger is wirelessly connected to the control device, the target board and the wireless debugger perform data transmission through at least one peripheral interface, and the at least one peripheral interface includes a first peripheral interface;

the control device, is configured to send debugging instructions to the wireless debugger through a wireless communication link, and the debugging instructions are used to instruct debugging/stop debugging the target board;

the wireless debugger, is configured to parse the debugging instructions and convert the parsed debugging instructions so that the debugging instructions are adapted to a protocol of the first peripheral interface; and the wireless debugger, is further configured to transmit the converted debugging instructions to the to-be-debugged target board through the first peripheral interface.

Alternatively, in an embodiment of the present disclosure, the wireless debugging system further includes a wireless bridging device, and the wireless bridging device is connected to the control device through a USB general-purpose serial bus interface;

the control device, is specifically configured to transmit the debugging instructions to the wireless bridging device through the USB interface; and the wireless bridging device, is configured to send the debugging instructions to the wireless debugger through the wireless communication link.

Alternatively, in an embodiment of the present disclosure, the control device, is specifically configured to send the debugging instructions to the wireless debugger by Bluetooth transmission.

Alternatively, in an embodiment of the present disclosure, the first peripheral interface is an SWD Serial Wire Debugging interface; and the wireless debugger, is specifically configured to parse the debugging instructions and convert the parsed debugging instructions into a format of an SWD interface protocol.

Alternatively, in an embodiment of the present disclosure, the wireless debugger, is specifically configured to transmit the converted debugging instructions to the target board through the first peripheral interface, when the debugging instructions instructs the target board to debug, to control the target board to debug; transmit the converted debugging instructions to the target board through the first peripheral interface, when the debugging instructions instructs the target board to suspend debugging, to control the target board to suspend debugging; and transmit the converted debugging instructions to the target board through the first peripheral interface, when the debugging instructions instructs the target board to perform single-step debugging, to control the target board to perform single-step debugging.

Alternatively, in an embodiment of the present disclosure, the at least one peripheral interface further includes a second peripheral interface; the target board, is further configured to transmit log information to the wireless debugger through the second peripheral interface; and the wireless debugger, is further configured to transmit the log information to the control device through the wireless communication link.

In the embodiments of the present disclosure, the wireless debugger receives the debugging instructions through the wireless communication module, transmits the debugging instructions to the target board through the peripheral interface, and debugs the target board. For a target board that needs to be debugged in motion, debugging control is more convenient and more reliable.

BRIEF DESCRIPTION OF THE DRAWINGS

Hereinafter, some specific embodiments of the embodiments of the present disclosure will be described in detail by way of example rather than limiting with reference to the accompanying drawings. The same reference numerals in the accompanying drawings designate the same or similar components or parts. Those skilled in the art should appreciate that these accompanying drawings are not necessarily drawn to scale. In the accompanying drawings.

DETAILED DESCRIPTION OF EMBODIMENTS

The specific implementation of the embodiments of the present disclosure will be further explained below with reference to the accompanying drawings of the embodiments of the present disclosure.

Embodiment 1

Figure 1:
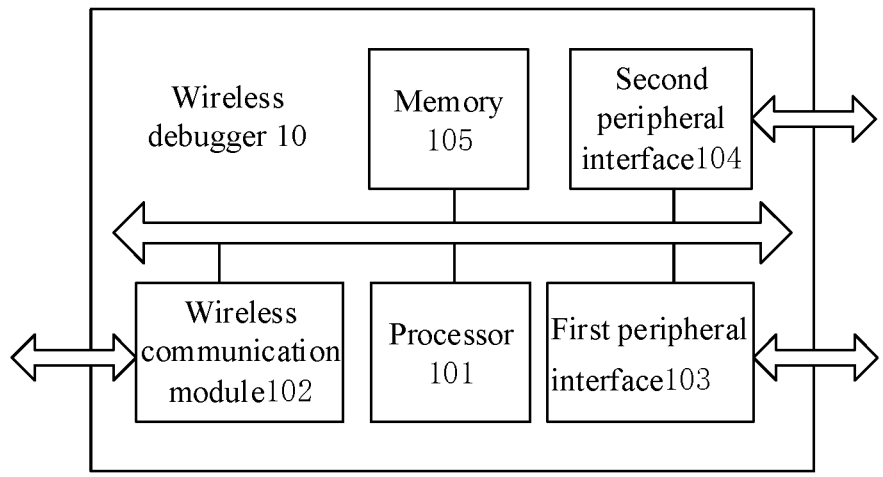
FIG. 1 is a structural diagram of a wireless debugger according to an embodiment of the present disclosure.

An embodiment of the present disclosure provides a wireless debugger. As shown in FIG. 1, FIG. 1 is a structural diagram of a wireless debugger according to an embodiment of the present disclosure. The wireless debugger 10 includes: a processor 101, a wireless communication module 102 and a first peripheral interface 103; the processor 101 is electrically connected to the wireless communication module 102 and the first peripheral interface 103, respectively;

the processor 101, is configured to receive debugging instructions through the wireless communication module 102, and the debugging instructions are used to instruct debugging/stop debugging a target board;

the processor 101, is further configured to parse the debugging instructions and convert the parsed debugging instructions so that the debugging instructions are adapted to a protocol of the first peripheral interface 103; and the processor 101, is further configured to transmit the converted debugging instructions to the to-be-debugged target board through the first peripheral interface 103.

It should be noted that, in an application scenario, the wireless debugger 10 may receive debugging instructions transmitted by a control device, and the wireless debugger 10 and the control device perform data transmission through the wireless communication module 102.

In the present disclosure, the target board is a to-be-debugged circuit board. The term "target" in the present disclosure is used to indicate the singular without any limitation. The target board may be an IC (Integrated Circuit) board, or an PCB (Printed Circuit Board), etc. The present disclosure does not limit the specific form of the target board. After the target board receives the debugging instructions, it debugs/stops debugging according to the debugging instructions. Here, a specific example is given to explain how the debugging instructions instructs, for example, alternatively, in an embodiment of the present disclosure, the processor 101 is specifically configured to transmit the converted debugging instructions to the target board through the first peripheral interface 103, when the debugging instructions instructs the target board to debug, to control the target board to debug; transmit the converted debugging instructions to the target board through the first peripheral interface 103, when the debugging instructions instructs the target board to suspend debugging, to control the target board to suspend debugging; and transmit the converted debugging instructions to the target board through the first peripheral interface 103, when the debugging instructions instructs the target board to perform single-step debugging, to control the target board to perform single-step debugging.

The processor 101 may be a micro-control core, or a CPU (Central Processing Unit, central processing unit 101), and the like, which is not limited in the present disclosure.

The wireless communication module 102 may include a wireless local area network module (for example, a wireless local area network card). The control device and the wireless debugger 10 may be connected to the same local area network, and the control device transmits the debugging instructions to the wireless debugger 10 through the local area network. The control device and the wireless debugger 10 may also access the wide area network through the local area network, and the control device transmits the debugging instructions to the wireless debugger 10 through the local area network and the wide area network. The wireless communication module 102 may further include a wireless wide area network module (for example, a wireless wide area network card), and the control device transmits the debugging instructions to the wireless debugger 10 through the wide area network. The wireless communication module 102 may further include a Bluetooth module. The control device and the wireless debugger 10 perform Bluetooth pairing, and the control device transmits the debugging instructions to the wireless debugger 10 by Bluetooth connection.

Specifically, in an embodiment of the present disclosure, the wireless communication module 102 may include at least one of a Bluetooth module, a Wi-Fi module, and a 2.4G module.

Alternatively, in an embodiment of the present disclosure, the Bluetooth module includes a BLE (Bluetooth Low Energy) chip and an antenna, and the BLE chip is electrically connected to the antenna. The Bluetooth module of the wireless debugger 10 may be connected to the Bluetooth module of the control device through BLE technology. The processor 101 is further configured to initialize a BLE protocol stack by starting a system program to enable BLE broadcast, and to connect to the Bluetooth module of the control device through the BLE broadcast. Alternatively, Bluetooth 5.0 wireless connection technology may be used, which has the advantages of high bandwidth, high transmission power, higher stability, and better security. Of course, BLE is only one method of Bluetooth connection, and does not mean that the present disclosure is limited thereto.

Alternatively, in an embodiment of the present disclosure, the first peripheral interface 103 includes at least one of the following interfaces: a Serial Wire Debugging (SWD) interface, a Serial Peripheral Interface (SPI), an Inter-Integrated Circuit (I2C), an Integrate-Interface Circuit (IIS), a General-Purpose Input/Output (GPIO), or a Pulse Width Modulation (PWM).

Alternatively, in an embodiment of the present disclosure, the first peripheral interface 103 is the SWD Serial Wire Debugging interface; and the wireless debugger 10 is specifically configured to parse the debugging instructions and convert the parsed debugging instructions into the format of a SWD interface protocol.

Alternatively, in an embodiment of the present disclosure, the first peripheral interface 103 is the GPIO general-purpose input/output interface, and the GPIO interface is configured with an SWD protocol as the SWD interface simulated.

The processor 101 is further configured to initialize the SWD Serial Wire Debugging interface by starting the system program.

Alternatively, in an embodiment of the present disclosure, the wireless debugger 10 further includes a second peripheral interface 104; and the processor 101 is further configured to receive log information transmitted by the target board through the second peripheral interface 104.

It should be noted that the log information is used to indicate data of the target board during debugging. For example, in an application scenario, the target board is installed on a drone, and the log information may indicate at least one of the following: flight distance, flight time, flight height, remaining flight time, etc. of the drone; in another example, in another application scenario, the target board is installed on a wearable bracelet, and when a user wears the wearable bracelet, the log information may indicate at least one of the following: the number of exercise steps of the user, calories consumed of the user, the user's heart rate, the user's body temperature, etc. Of course, here is only an exemplary description, and does not mean that the present disclosure is limited thereto.

Alternatively, in an embodiment of the present disclosure, the second peripheral interface 104 is a UART universal asynchronous receiver transmitter interface.

The second peripheral interface 104 includes at least one of the following interfaces: an SWD interface, an SPI, an I2C interface, an IIS interface, a GPIO interface, or a PWM interface. Of course, here is only an exemplary description and does not mean that the present disclosure is limited thereto. In the present disclosure, "first" and "second" are only used to indicate a distinction and are not used as any limitation. Here, the first peripheral interface 103 and the second peripheral interface 104 are only used to describe different functions implemented. In an actual hardware structure, the first peripheral interface 103 and the second peripheral interface 104 may be the same interface or different interfaces, which is not limited in the present disclosure.

When the first peripheral interface 103 and the second peripheral interface 104 are different interfaces, log information transmission and debugging may be implemented in parallel to improve the efficiency of debugging.

Alternatively, in an embodiment of the present disclosure, the wireless debugger 10 further includes a memory 105 electrically connected to the processor 101; and the memory 105 is configured to store data and a program executed by the processor 101.

The memory 105 may include SRAM (Static Random-Access Memory 105) and Flash (Flash Electrically Erasable Programmable Read Only Memory), where SRAM may store the system program required for operation of the wireless debugger 10 (system program of the wireless debugger 10), and Flash may store the debugging instructions, which may be deleted after the debugging instructions are transmitted to the target board, and store a new debugging instruction. Of course, here is only an exemplary description, the memory 105 may also include other types of storage medium, and is not limited to SRAM and Flash. The memory 105 may be integrated with the processor 101; and may also exist separately from the processor 101, and the processor 101 may be electrically connected to the memory 105 via a bus.

In the embodiments of the present disclosure, the wireless debugger receives the debugging instructions through the wireless communication module, transmits the debugging instructions to the target board through the peripheral interface, and debugs the target board. For a target board that needs to be debugged in motion, debugging control is more convenient and more reliable.

Embodiment 2

Figure 2:
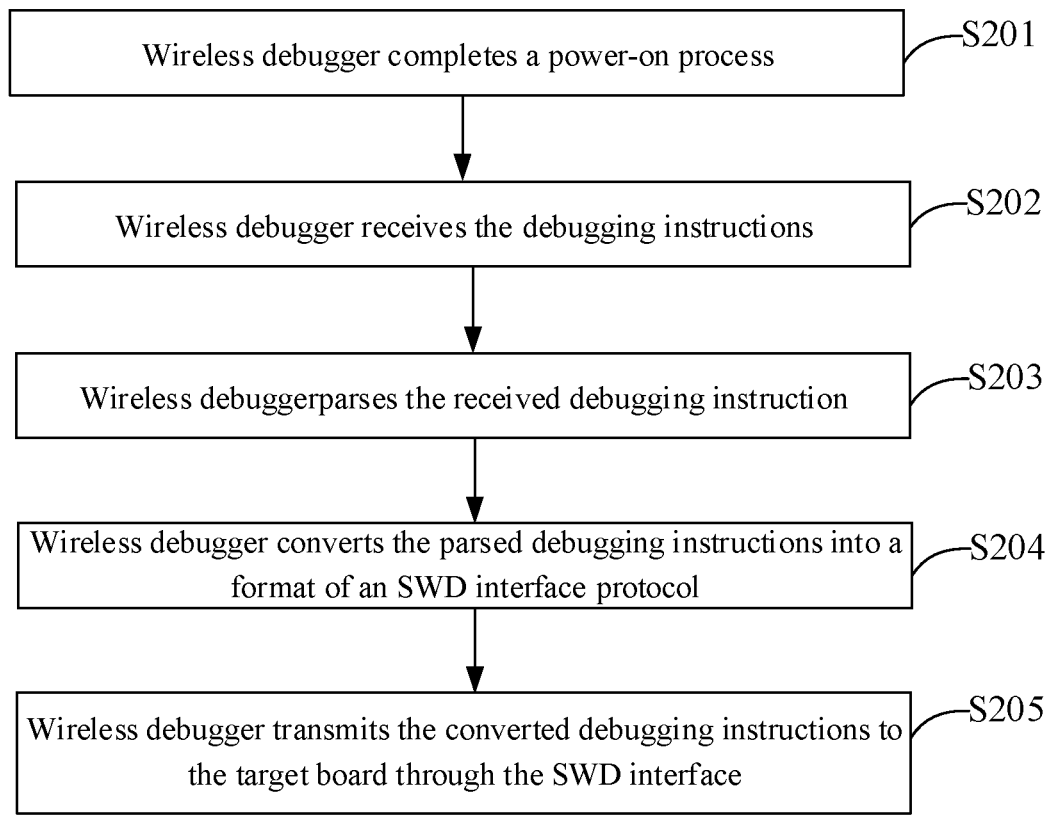
FIG. 2 is a flowchart of a debugging method according to an embodiment of the present disclosure.

Based on the wireless debugger described in Embodiment 1, Embodiment 2 of the present disclosure provides a debugging method, applied to the wireless debugger described in Embodiment 1. FIG. 2 is a flowchart of a debugging method according to an embodiment of the present disclosure, as shown in FIG. 2, in the present embodiment, the wireless communication module includes a Bluetooth module, and the first peripheral interface is the SWD interface. The method includes the following steps:

S201, the wireless debugger completes a power-on process.

The power-on process may include loading the system program of the wireless debugger to initialize a BLE protocol stack, initializing the SWD Serial Wire Debugging interface, and so on.

Figure 3:
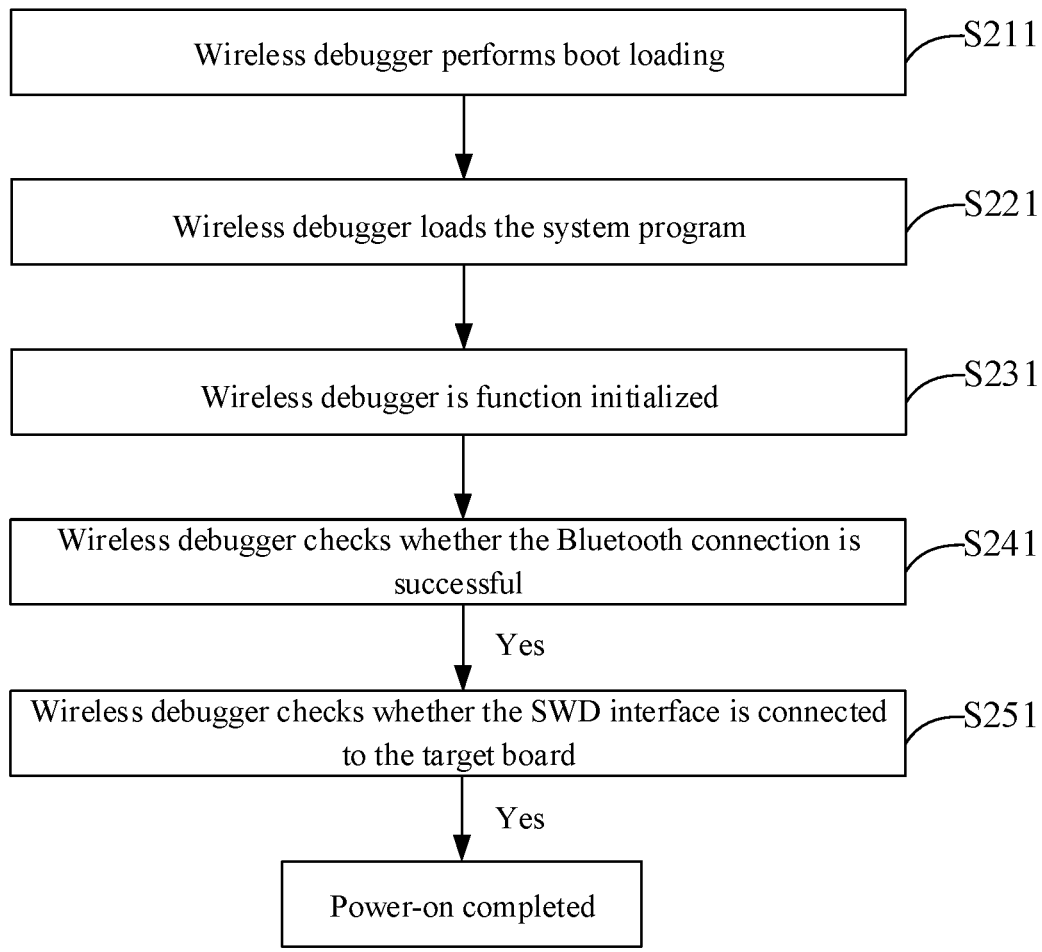
FIG. 3 is a flowchart of a wireless debugger power-on process according to an embodiment of the present disclosure.

Specifically, FIG. 3 is a flowchart of a wireless debugger power-on process according to an embodiment of the present disclosure. As shown in FIG. 3, the power-on process includes the following steps:

S211, the wireless debugger performs boot loading.

Boot loading is Bootloader. This phrase mainly includes the minimum configuration content required for system boot, including initializing system running clock, C running stack, data area copy, Flash running initialization, etc.

S221, the wireless debugger loads the system program.

Loading the system program may be realized by calling the SYSTEM_INIT function. This phrase mainly includes initializing the BLE protocol stack and configuring a PWR (power control) energy management mode.

S231, the wireless debugger is function initialized.

The function initialization is realized by calling the APP_INIT function. This phrase mainly includes initializing the SWD Serial Wire Debugging interface, at the same time setting broadcast parameters, and enabling the BLE broadcast to connect with the Bluetooth module of the control device. The wireless debugger may perform Bluetooth broadcast and wait for the control device to initiate a connection. When Bluetooth connection is successful, it enters a command waiting mode and waits for the control device to transmit a to-be-debugged firmware.

S241, the wireless debugger checks whether the Bluetooth connection is successful.

After confirming that the Bluetooth connection is successful, it indicates that the debugging instructions transmitted by the control device may be received.

S251, the wireless debugger checks whether the SWD interface is connected to the target board.

After confirming that the SWD interface is connected to the target board, the power-on process may be ended and the target board may be debugged.

After the wireless debugger power-on process is over, the target board may be debugged:

S202, the wireless debugger receives the debugging instructions.

S203, the wireless debugger parses the received debugging instruction.

The debugging instructions received by the wireless debugger through the wireless communication module needs to be parsed according to a wireless communication protocol. For example, in the present embodiment, the debugging instructions may be parsed according to the BLE protocol.

S204, the wireless debugger converts the parsed debugging instructions into a format of an SWD interface protocol.

After the debugging instructions are converted into the format of the SWD protocol, the target board may receive the debugging instructions through the SWD interface and debug/stop debugging according to the instruction of the debugging instructions.

S205, the wireless debugger transmits the converted debugging instructions to the target board through the SWD interface.

During the debugging, if the wireless debugger receives log information of the target board, it may also transmit the log information to the control device, and detailed description thereof will be omitted.

Embodiment 3

Figure 4:
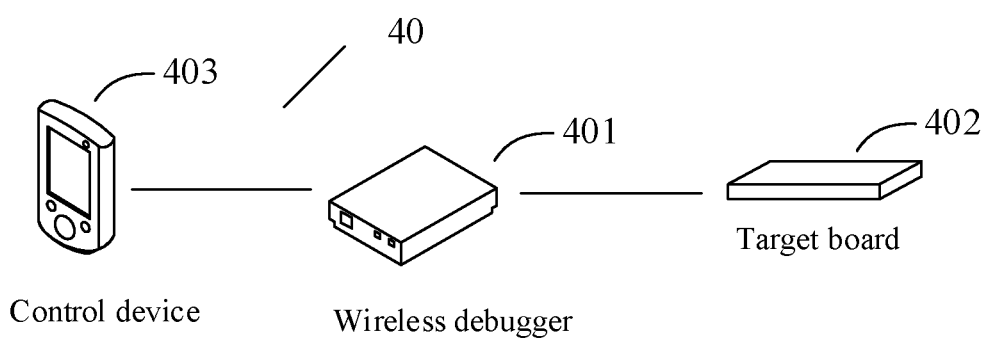
FIG. 4 is a structural diagram of a debugging system according to an embodiment of the present disclosure.

Based on a wireless debugger provided in Embodiment 1 of the present disclosure, Embodiment 3 of the present disclosure provides a wireless debugging system. As shown in FIG. 4, FIG. 4 is a structural diagram of a debugging system according to an embodiment of the present disclosure. The wireless debugging system 40 includes: a wireless debugger 401, a target board 402, and a control device 403. The wireless debugger 401 is the wireless debugger 10 described in Embodiment 1. The wireless debugger 401 is wirelessly connected to the control device 403. The target board 402 and the wireless debugger 401 perform data transmission through at least one peripheral interface, and the at least one peripheral interface includes a first peripheral interface;

the control device 403, is configured to send debugging instructions to the wireless debugger 401 through a wireless communication link, and the debugging instructions are used to instruct debugging/stop debugging the target board 402;

the wireless debugger 401, is configured to parse the debugging instructions and convert the parsed debugging instructions so that the debugging instructions are adapted to a protocol of the first peripheral interface; and the wireless debugger 401, is further configured to transmit the converted debugging instructions to the to-be-debugged target board 402 through the first peripheral interface.

It should be noted that the control device 403 may perform data transmission with the wireless debugger 401 through its integrated wireless communication module, and may also perform wireless communication through an external device. Here are two specific examples for illustration:

Alternatively, in the first example, the wireless debugging system 40 further includes a wireless bridging device, and the wireless bridging device is connected to the control device 403 through a USB general-purpose serial bus interface;

the control device 403, is specifically configured to transmit the debugging instructions to the wireless bridging device through the USB interface; and the wireless bridging device, is configured to send the debugging instructions to the wireless debugger 401 through the wireless communication link.

The wireless bridging device may be a dongle device (software protector) or an external wireless network card. Of course, here is only an exemplary description and does not mean that the present disclosure is limited thereto. Because the wireless bridging device is connected to the control device 403 through the USB interface, in the power-on process, it is necessary to check whether the USB interface is connected to the control device 403. The power-on flow of the wireless bridging device is similar to the power-on flow of the wireless debugger 401, and detailed description thereof will be omitted.

Alternatively, in the second example, the control device403, is specifically configured to transmit the debugging instructions to the wireless debugger 401 through its integrated wireless communication module. Here, the control device 403 may be a terminal device having wireless communication function. For example, the control device 403 may be a smart phone, a tablet computer, a computer device, or the like. The user may operate on the control device 403 to control the debugging process.

Alternatively, in an embodiment of the present disclosure, the control device403, is specifically configured to send the debugging instructions to the wireless debugger 401 by Bluetooth transmission.

Alternatively, in an embodiment of the present disclosure, the first peripheral interface is the SWD Serial Wire Debugging interface; and the wireless debugger 401, is specifically configured to parse the debugging instructions and convert the parsed debugging instructions into a format of an SWD interface protocol.

Alternatively, in an embodiment of the present disclosure, the wireless debugger 401, is specifically configured to transmit the converted debugging instructions to the target board 402 through the first peripheral interface, when the debugging instructions instructs the target board 402 to debug, to control the target board 402 to debug; transmit the converted debugging instructions to the target board 402 through the first peripheral interface, when the debugging instructions instructs the target board 402 to suspend debugging, to control the target board 402 to suspend debugging; and transmit the converted debugging instructions to the target board 402 through the first peripheral interface, when the debugging instructions instructs the target board 402 to perform single-step debugging, to control the target board 402 to perform single-step debugging.

Alternatively, in an embodiment of the present disclosure, the wireless debugger 401, is further configured to receive a debugging result transmitted by the target board 402 through at least one peripheral interface, and transmit the debugging result to the control device 403 through the wireless communication module. For example, the target board 402 may transmit the debugging result to the wireless debugger 401 through the first peripheral interface.

Alternatively, in an embodiment of the present disclosure, the at least one peripheral interface further includes a second peripheral interface; the target board 402, is further configured to transmit log information to the wireless debugger 401 through the second peripheral interface; and the wireless debugger 401, is further configured to transmit the log information to the control device 403 through the wireless communication link.

In the embodiments of the present disclosure, the wireless debugger receives the debugging instructions through the wireless communication module, transmits the debugging instructions to the target board through the peripheral interface, and debugs the target board. For a target board that needs to be debugged in motion, debugging control is more convenient and more reliable.

The control device in the embodiments of the present disclosure takes in various forms, including but is not limited to:

(1) Mobile communication device: this type of device is characterized by mobile communication function, and its main goal is to provide voice and data communication. Such terminals include: smart phones (such as iPhone), multimedia cellphones, feature cellphones, low-end cellphones or the like.

(2) Ultra-mobile personal computer device: this type of device belongs to the category of personal computer, has computing and processing functions, and generally has mobile Internet access characteristics. Such terminals include: PDAs, MIDs, and UMPC devices, such as iPad.

(3) Portable entertainment equipment: this type of device may display and play multimedia content. Such devices include: audio and video players (such as iPod), hand-held game consoles, e-books, smart toys and portable vehicle-mounted navigation devices.

(4) Other electronic devices having data interaction functions.

So far, specific embodiments of the present subject matter have been described. Other embodiments are within the scope of the appended claims. In some cases, the actions recited in the claims may be performed in a different order and still achieve the desired result. In addition, the processes depicted in the accompanying drawings do not necessarily require the particular order or sequential order shown to achieve the desired result. In some embodiments, multitasking and parallel processing may be advantageous.

In the 1990s, for a technical improvement, it can be clearly distinguished whether it is an improvement in hardware (for example, an improvement in circuit structures such as diodes, transistors, or switches) or an improvement in software (an improvement on method flow). However, with the development of technology, today, many method flow improvements may be regarded as direct improvements in the hardware circuit structure. Designers almost always get the corresponding hardware circuit structure by programming the improved method flow into the hardware circuit. Therefore, it cannot be said that an improvement on the method flow cannot be realized by a hardware entity module. For example, a programmable logic device (PLD) (such as a Field Programmable Gate Array (FPGA)) is such an integrated circuit whose logic function is determined by the user programming the device. Designers themselves may program to "integrate" a digital system on a piece of PLD, without having to ask a chip manufacturer to design and manufacture a dedicated integrated circuit chip. Moreover, nowadays, instead of manufacturing integrated circuit chips manually, this programming is also mostly implemented using "logic compiler" software, which is similar to the software compiler used in program development and writing. To compile the original source code, it have to be written in a specific programming language, which is called Hardware Description Language (HDL). There is not only one type of HDL, but many types, such as ABEL (Advanced Boolean Expression Language), AHDL (Altera Hardware Description Language), Confluence, CUPL (Cornell University Programming Language), HDCal, JHDL (Java Hardware Description Language), Lava, Lola, MyHDL, PALASM, or RHDL (Ruby Hardware Description Language). Currently the most commonly used are VHDL (Very-High-Speed Integrated Circuit Hardware Description Language) and Verilog. Those skilled in the art should also be clear that as long as the method flow is slightly logical programmed and programmed into the integrated circuit using the above-mentioned several hardware description languages, a hardware circuit that implements the logic method flow may be easily obtained.

Those skilled in the art should understand that the embodiments of the present disclosure may be provided as a method, a system, or a computer program product. Therefore, the present disclosure may take the form of an entirely hardware embodiment, an entirely software embodiment, or an embodiment combining software and hardware aspects. Moreover, the present disclosure may take the form of a computer program product implemented on one or more computer-usable storage medium (including but not limited to disk storage, CD-ROM, optical storage, etc.) containing computer-usable program code.

The present disclosure is described with reference to flowcharts and/or block diagrams of the method, device (system), and computer program product according to the embodiments of the present disclosure. It should be understood that each flow and/or block in the flowcharts and/or block diagrams, and combinations of flows and/or blocks in the flowcharts and/or block diagrams may be implemented by computer program instructions. These computer program instructions may be provided to a processor of a general-purpose computer, dedicated computer, embedded processor, or other programmable data processing device to produce a machine, such that instructions executed by the processor of the computer or other programmable data processing device produce an apparatus for implementing the functions specified in one or more flows of the flowcharts and/or one or more blocks of the block diagrams.

These computer program instructions may also be stored in a computer-readable memory capable of directing the computer or other programmable data processing device to work in a specific method such that the instructions stored in the computer-readable memory produce a product that includes an instruction apparatus that implements the functions specified in one or more flows of the flowcharts and/or one or more blocks of the block diagrams.

These computer program instructions may also be loaded onto the computer or other programmable data processing device, such that a series of operation steps may be performed on the computer or other programmable device to produce a computer-implemented process, such that the instructions executed on the computer or other programmable device provide steps for implementing the functions specified in one or more flows of the flowcharts and/or one or more blocks of the block diagrams.

In a typical configuration, a computing device includes one or more processors (CPUs), input/output interfaces, network interfaces, and memories.

Memory may include non-persistent memory, random access memory (RAM), and/or non-volatile memory in computer-readable medium, such as read-only memory (ROM) or flash memory (flash RAM). Memory is an example of a computer-readable medium.

Computer-readable medium includes both permanent and non-persistent, removable and non-removable media. Information may be stored by any method or technology. Information may be computer-readable instructions, data structures, program modules, or other data. Examples of computer storage medium include, but are not limited to, phase-change random access memory (PRAM), static random access memory (SRAM), dynamic random access memory (DRAM), other types of random access memory (RAM), read-only memory (ROM), electrically erasable programmable read-only memory (EEPROM), flash memory or other memory technologies, read-only disc read-only memory (CD-ROM), digital versatile disc (DVD) or other optical storage, magnetic tape cartridges, magnetic tape, magnetic disk storage or other magnetic storage devices, or any other non-transmission medium that may be used to store information that can be accessed by the computing device. As defined herein, the computer-readable medium does not include temporary computer-readable media (transitory media) such as modulated data signals and carrier waves.

It should also be noted that the terms "including," "comprising," or any other variation thereof are intended to encompass non-exclusive inclusion, such that a process, method, product, or device that includes a series of elements includes not only those elements but also other elements not explicitly listed, or those that are inherent to such process, method, product, or device. Without more restrictions, the elements defined by the sentence "including a . . . " do not exclude the existence of other identical elements in the process, method, product or device including the said elements.

Those skilled in the art should understand that the embodiments of the present disclosure may be provided as a method, a system, or a computer program product. Therefore, the present disclosure may take the form of an entirely hardware embodiment, an entirely software embodiment, or an embodiment combining software and hardware aspects. Moreover, the present disclosure may take the form of a computer program product implemented on one or more computer-usable storage medium (including but not limited to disk storage, CD-ROM, optical storage, etc.) containing computer-usable program code.

The present disclosure may be described in the general context of computer-executable instructions executed by the computer, such as program modules. Generally, program modules include routines, programs, objects, components, data structures, etc. that perform specific transactions or implement specific abstract data types. The present disclosure may also be practiced in distributed computing environments in which transactions are performed by remote processing devices connected through a communication network. In a distributed computing environment, program modules may be located in local and remote computer storage medium, including storage devices.

The embodiments in this specification are described in a progressive method, and the same or similar parts between the embodiments may refer to each other. Each embodiment focuses on the differences from other embodiments. Specifically, for the system embodiment, since it is basically similar to the method embodiment, the description thereof is relatively simple. For relevant parts, it may refer to the description of the method embodiment.

The above description is merely embodiments of the present disclosure and is not intended to limit the present disclosure. For those skilled in the art, the present disclosure may have various modifications and changes. Any modification, equivalent replacement, improvement, etc. made within the spirit and principle of the present disclosure shall be included in the scope of the claims of the present disclosure.

What is claimed is:

1. A wireless debugger, comprising: a processor, a wireless communi-cation module, and a first peripheral interface; the processor being electrically connected to the wireless communication module and the first peripheral interface respectively;

the processor, being configured to receive, through the wireless communication module, debugging instructions-transmitted by a control device, and the debugging instructions being used to instruct debugging/stop debugging a target board;

the processor, being further configured to parse the debugging instructions and convert the parsed debugging instructions so that the debugging instructions are adapted to a protocol of the first peripheral interface; and the processor, being further configured to transmit the converted debugging instructions to the target board through the first peripheral interface;

wherein the wireless debugger further comprises a second peripheral interface, and the pro-cessor is further configured to receive log information transmitted by the target board through the second peripheral interface, and transmit the log information to the control device through the wireless communication module.

2. The wireless debugger according to claim 1, wherein, the wireless communica-tion module comprises at least one of a Bluetooth module, a Wi-Fi module, or a 2.4G module.

3. The wireless debugger according to claim 1, wherein, the Bluetooth module comprises a Bluetooth low energy (BLE) chip and an antenna, and the BLE chip is electrically connected to the antenna.

4. The wireless debugger according to claim 1, wherein, the first pe-ripheral interface comprises at least one of following interfaces: a Serial Wire Debugging (SWD) interface, a Serial Peripheral Interface (SPI), an Inter-Integrated Circuit (I2C) interface, an Inte-grate-Interface of Sound (IIS) interface, a General-Purpose Input/Output (GPIO) interface, or a Pulse Width Modulation (PWM) interface.

5. The wireless debugger according to claim 4, wherein, the first peripheral inter-face is the SWD interface; and
the wireless debugger, is specifically configured to parse the debugging instructions and convert the parsed debugging instructions into a format of an SWD interface protocol.

6. The wireless debugger according to claim 4, wherein, the first peripheral inter-face is the GPIO general-purpose input/output interface, and the GPIO interface is configured with an SWD protocol as the SWD interface simulated.

7. The wireless debugger according to claim 1, wherein, the processor, is specifically configured to transmit the converted debugging instructions to the target board through the first peripheral interface, when the debugging instructions instruct the target board to debug, to control the target board to debug; transmit the converted debugging instructions to the target board through the first peripheral interface, when the debugging instructions instruct the target board to suspend debugging, to control the target board to suspend debugging; and transmit the converted debugging instructions to the tar-get board through the first peripheral interface, when the debugging instructions instruct the target board to perform single-step debugging, to control the target board to perform the single-step debugging.

8. The wireless debugger according to claim 1, wherein the sec-ond peripheral interface is a Universal Asynchronous Receiver/Transmitter (UART) universal asynchronous receiver transmitter interface.

9. The wireless debugger according to claim 1, wherein, the wireless debugger further comprises a memory, and
the memory is electrically con-nected to the processor; and
the memory, is configured to store data and a program executed by the processor.

10. A wireless debugging system, comprising: a wireless debugger according to claim 1, a target board, and a control device, the wireless debugger being wirelessly connected to the control device, the target board and the wireless debugger performing data transmission through at least one peripheral interface, and the at least one peripheral interface comprising the first peripheral interface of the wireless debugger;
the control device, being configured to send debugging instructions to the wireless debugger via a wireless communication link, and the debugging instructions being used to instruct debug-ging/stop debugging the target board;
the wireless debugger, being configured to parse the debugging instructions and convert the parsed debugging instructions so that the debugging instructions are adapted to a protocol of the first peripheral interface; and
the wireless debugger, being further configured to transmit the converted debugging instruc-tions to the target board through the first peripheral interface;
the at least one peripheral interface further comprises the second peripheral interface of the wireless debugger;
the target board, is further configured to transmit log information to the wireless debugger through the second peripheral interface; and
the wireless debugger, is further configured to receive the log information transmitted by the target board through the second peripheral interface, and transmit the log information to the control device through the wireless communication link.

11. The system according to claim 10, wherein,
the wireless debugging system further comprises a wireless bridging device, and the wire-less bridging device is connected to the control device through a universal serial bus (USB) interface;
the control device, is configured to transmit the debugging instructions to the wireless bridging device through the USB interface; and
the wireless bridging device, is configured to send the debugging instructions to the wireless debugger through the wireless communication link.

12. The system according to claim 10, wherein,
the control device, is specifically configured to send the debugging instructions to the wire-less debugger by Bluetooth transmission.

13. The system according to claim 10, wherein,
the first peripheral interface is an SWD Serial Wire Debugging interface; and
the wireless debugger, is specifically configured to parse the debugging instructions and convert the parsed debugging instructions into a format of an SWD interface protocol.

14. The system according to claim 10, wherein,
the wireless debugger, is specifically configured to transmit the converted debugging in-structions to the target board through the first peripheral interface, when the debugging instruc-tions instruct the target board to debug, to control the target board to debug; transmit the converted debugging instructions to the target board through the first peripheral interface, when the debugging instructions instruct the target board to suspend debugging, to control the target board to suspend debugging; and transmit the converted debugging instructions to the target board through the first peripheral interface, when the debugging instructions instruct the target board to perform single-step debugging, to control the target board to perform the single-step debugging.

* * * * *